United States Patent
Jesper et al.

(10) Patent No.: US 9,433,054 B2
(45) Date of Patent: Aug. 30, 2016

(54) LIGHT EMITTING APPARATUS WITH AMBIENT LIGHT SENSOR

(71) Applicant: Seoul Semiconductor Co., Ltd., Ansan-si (KR)

(72) Inventors: Bennike Jesper, Ansan-si (KR); Ektay Eminovski, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/436,807

(22) PCT Filed: Feb. 1, 2013

(86) PCT No.: PCT/KR2013/000837
§ 371 (c)(1),
(2) Date: Apr. 17, 2015

(87) PCT Pub. No.: WO2014/061879
PCT Pub. Date: Apr. 24, 2014

(65) Prior Publication Data
US 2015/0271892 A1    Sep. 24, 2015

(30) Foreign Application Priority Data

Oct. 18, 2012   (KR) .......................... 10-2012-0116204

(51) Int. Cl.
*H05B 37/02*   (2006.01)
*H05B 33/08*   (2006.01)
(Continued)

(52) U.S. Cl.
CPC ............. *H05B 33/0869* (2013.01); *F21K 9/56* (2013.01); *G03B 15/05* (2013.01); *H04N 5/2256* (2013.01);
(Continued)

(58) Field of Classification Search
CPC ............. H05B 37/0218; H05B 33/08; H05B 37/0227; H05B 37/027; H05B 33/0854; H05B 33/0872; H05B 33/0815; H05B 33/0821; H05B 33/0827; H05B 33/0845; H05B 37/0245; H05B 33/0869; H05B 37/029; H05B 33/0842; H05B 33/086; H05B 33/0809; H05B 33/0824; H05B 33/083; H05B 33/0857; H05B 33/0863; H05B 37/0263
See application file for complete search history.

(56) References Cited

U.S. PATENT DOCUMENTS

2009/0121641 A1    5/2009  Shih
2009/0243493 A1*  10/2009  Bergquist ............... G03B 15/05
                                                            315/149

(Continued)

FOREIGN PATENT DOCUMENTS

KR    1020060054622 A    5/2006
WO    2008035234          3/2008

OTHER PUBLICATIONS

Lee, Dong Yun, Authorized Officer, Korean Intellectual Property Office, International Search Report, International Application No. PCT/KR2013/000837, Jun. 27, 2013, 2 pages.

(Continued)

*Primary Examiner* — Jany Richardson
(74) *Attorney, Agent, or Firm* — Perkins Coie LLP

(57) ABSTRACT

Disclosed herein is a light emitting apparatus. The light emitting apparatus includes a first light emitting unit including a first light emitting diode and a first phosphor; a second light emitting unit including a second light emitting diode and a second phosphor; an ambient light sensor, and a controller. The ambient light sensor detects a spectrum distribution of ambient light, and the controller operates the first and second light emitting units with reference to the spectrum distribution of the ambient light detected by the ambient light sensor. A light emitting unit is divided into two or more light emitting units and the ambient light sensor is provided to operate the first and second light emitting units corresponding to the spectrum distribution of ambient light.

18 Claims, 2 Drawing Sheets

(51) Int. Cl.
    *H04N 5/225*     (2006.01)
    *H04N 5/235*     (2006.01)
    *F21K 99/00*     (2016.01)
    *G03B 15/05*     (2006.01)
    H01L 25/075     (2006.01)
    H01L 33/50     (2010.01)
    F21Y 101/02     (2006.01)
    F21Y 113/00     (2016.01)

(52) U.S. Cl.
    CPC ........ *H04N 5/2354* (2013.01); *H05B 37/0218* (2013.01); *F21Y 2101/02* (2013.01); *F21Y 2113/005* (2013.01); *H01L 25/0753* (2013.01); *H01L 33/50* (2013.01); *H01L 2924/0002* (2013.01); *Y02B 20/46* (2013.01)

(56) References Cited

U.S. PATENT DOCUMENTS

| | | |
|---|---|---|
| 2010/0182294 A1 | 7/2010 | Roshan et al. |
| 2011/0254039 A1* | 10/2011 | Kim ................... H01L 33/46 257/98 |
| 2012/0026356 A1 | 2/2012 | Nakagawara et al. |
| 2012/0038280 A1 | 2/2012 | Zoorob et al. |
| 2012/0084126 A1 | 4/2012 | Zampini et al. |
| 2012/0146548 A1 | 6/2012 | Campbell et al. |

OTHER PUBLICATIONS

European Patent Office, Supplementary Search Report, EP Application No. 13847266.7, Apr. 6, 2016, 8 pages.

\* cited by examiner

LIGHT EMITTING APPARATUS WITH AMBIENT LIGHT SENSOR

CROSS REFERENCE TO RELATED APPLICATION

This patent document is a 35 U.S.C. 371 National Stage application of PCT Application No. PCT/KR2013/000837, filed on Feb. 1, 2013, which further claims the benefits and priority of prior Korean Patent Application No. 10-2012-0116204, filed in the Republic of Korea on Oct. 18, 2012. The entire contents of the above applications are incorporated by reference in their entirety as part of this document.

TECHNICAL FIELD

The present invention generally relates to a light emitting apparatus used as an assistant light source or a light source for a camera flash or various imaging devices, and more particularly, to a light emitting apparatus capable of emitting light so as to match with spectra of ambient light.

BACKGROUND ART

Generally, in an imaging device which forms images on a detector such as an image sensor using a white light source, an assistant light source has a very important role at low illuminance. Here, an image sensor refers to a semiconductor device configured to generate electric signals in response to light reflected by an object, that is, to convert an optical image into an electric signal, and a charge coupled device (CCD) and a complementary metal-oxide semiconductor (CMOS) image sensor are generally used as the image sensor.

In particular, the CMOS image sensor includes an amplifier in each cell of an equivalent circuit, has less noise in electric signals converted from light, and can realize actual colors through cells, which correspond to red/green/blue light and are arranged to intersect each other. In addition, since mass production of CMOS image sensors can be achieved through application of a CMOS logic LSI production processor, and the CMOS image sensors require low manufacturing cost and allow less power consumption due to a small size thereof as compared with CCD image sensors, the CMOS image sensors have mainly been used as components for DSLR cameras, which have been increasingly applied to camera phones and have been reduced in size in recent years.

However, since a CMOS image sensor applied to camera phones or advanced digital cameras has low detection sensibility at low illuminance, can easily become unstable and provides lots of noise in an image captured thereby, a camera flash also becomes important as an assistant light source at low illuminance.

FIG. 1 is a graph depicting spectral sensitivity of a CMOS image sensor for cameras. In this figure, blue, green, and red curves indicate sensitivity of the CMOS image sensor with respect to blue, green, and red light, respectively.

Referring to FIG. 1, spectral sensitivity of the CMOS image sensor has a wavelength range of a certain width with respect to each of the colors, in which the CMOS exhibits a lower spectral sensitivity with respect to blue light than other colors (green, red) and the highest spectral sensitivity with respect to red light.

Accordingly, in order to improve image quality of a digital camera, it is necessary for an assistant light source to have a spectrum wavelength distribution matching the spectral sensitivity of the CMOS image sensor with regard to the respective wavelengths. Such an assistant light source may be generally obtained by combination of a blue LED, a green phosphor and a red phosphor.

In mass production of light emitting devices, however, there can be deviation between the light emitting devices in terms of relative intensity between wavelength bands even when the light emitting devices emit light in a spectrum distribution matching the spectral sensitivity of the image sensor. Since it is difficult to adjust the relative intensity using electric current for operation, a light emitting device emitting light of unsatisfactory relative intensity between the wavelength bands will be determined to be a defective product. As a result, there is a problem of decrease of yield of light emitting devices for camera flashes.

Moreover, even when the spectrum distribution of the light emitting device matches the distribution of the spectral sensitivity of the CMOS image sensor, a spectrum distribution of light emitted from an assistant light source can often be different from that of ambient light. For example, when an image is captured using the assistant light source under illumination of relatively low color temperatures, the image includes an image of an object placed near a camera and illuminated by the assistant light source and an image of the background illuminated by ambient lighting. The object image and the background image have significantly different spectrum distributions due to a difference in spectrum distribution of the illumination light sources. Accordingly, unbalance occurs between the object image and background image, thereby providing a picture having an unnatural appearance.

DISCLOSURE OF INVENTION

Technical Problem

An aspect of the present invention is to provide a light emitting apparatus, which may provide a spectrum distribution of desired relative intensity based on operating parameters of a light emitting apparatus, thereby improving production yield.

Another aspect of the present invention is to provide an intelligent light emitting apparatus, which may adjust a spectrum distribution corresponding to variation of a spectrum distribution of ambient light.

Solution to Problem

In accordance with embodiments of the present invention, a light emitting apparatus includes: a first light emitting unit including a first light emitting diode and a first phosphor; a second light emitting unit including a second light emitting diode and a second phosphor; an ambient light sensor; and a controller, wherein the ambient light sensor detects a spectrum distribution of ambient light and the controller operates the first and second light emitting units with reference to the spectrum distribution of the ambient light detected by the ambient light sensor.

As such, a light emitting unit is divided into two or more light emitting units and the ambient light sensor is provided to operate the first and second light emitting units corresponding to a spectrum distribution of ambient light.

Meanwhile, the intensity of light emitted from the first and second light emitting units may be adjusted by adjusting magnitude or pulse widths of electric current for operating the first and second light emitting units.

The light emitting apparatus may further include a drive unit. The drive unit may operate the first and second light emitting units in a pulse width modulation manner.

The light emitting apparatus may further include a storage unit which stores spectrum distribution data according to electric current for each of the first and second light emitting units. Furthermore, the controller may operate the first and second light emitting units with reference to the data stored in the storage unit.

A spectrum distribution provided by combination of the first and second light emitting units may correspond to a wavelength distribution of spectral sensitivity of a CMOS image sensor. Accordingly, the light emitting apparatus may reduce power consumption since the first and second light emitting units do not emit light in an unnecessary wavelength band.

In some embodiments, the first and second light emitting diodes may emit ultraviolet (UV) light; the first phosphor may include a blue phosphor and a green phosphor; and the second phosphor may include a red phosphor and a green phosphor. Furthermore, the first light emitting unit emits blue light having a higher intensity than that of green light emitted therefrom; and the second light emitting unit emits red light having a higher intensity than that of green light emitted therefrom.

In other embodiments, the first and second light emitting diodes may emit blue light; the first phosphor may include a green phosphor; and the second phosphor may include a red phosphor. Furthermore, the first light emitting unit may emit green light having a higher intensity than that of blue light emitted therefrom; and the second light emitting unit emits red light having a higher intensity than that of blue light emitted therefrom.

The light emitting apparatus may be a flash device for a camera phone or a digital camera. In this case, the ambient light sensor may detect a spectrum distribution of ambient light. Accordingly, it is possible to provide a natural image using flash light matching ambient light, in which a difference in spectrum distribution between an object image and a background image is small.

In some embodiments, the ambient light sensor may also detect spectrum distributions of light emitted from the first and second light emitting units; and the controller may correct operating conditions of the first and second light emitting units by comparing the spectrum distributions of the light emitted from the first and second light emitting units as detected by the ambient light sensor with the spectrum distribution data of the first and second light emitting units stored in the storage unit. With this configuration, it is possible to correct the spectrum distribution of the first and second light emitting units before photographing an object. Furthermore, when a certain spectrum distribution of a color is set by a user, the controller may correct the operating conditions of the first and second light emitting units by comparing the spectrum distribution of the light emitted from the first and second light emitting units as detected by the ambient light sensor with the spectrum distribution set by a user.

The light emitting apparatus may be an indoor lighting apparatus. Here, the ambient light sensor may detect a spectrum distribution of outdoor light. Accordingly, it is possible to illuminate a room with a similar spectrum distribution to the spectrum distribution of ambient light.

Advantageous Effects of Invention

According to embodiments of the present invention, a spectrum distribution of a desired relative intensity may be obtained by adjusting operating parameters, such as magnitude or pulse widths of electric current. Accordingly, it is possible to improve yield of light emitting devices by increasing tolerance. In addition, according to the embodiments of the present invention, it is possible to provide an intelligent light emitting apparatus, which may adjust a spectrum distribution corresponding to variation of a spectrum distribution of ambient light.

BRIEF DESCRIPTION OF DRAWINGS

The above and other aspects, features, and advantages of the invention will become apparent from the detailed description of the following embodiments in conjunction with the accompanying drawings, in which.

MODE FOR THE INVENTION

Figure 1:
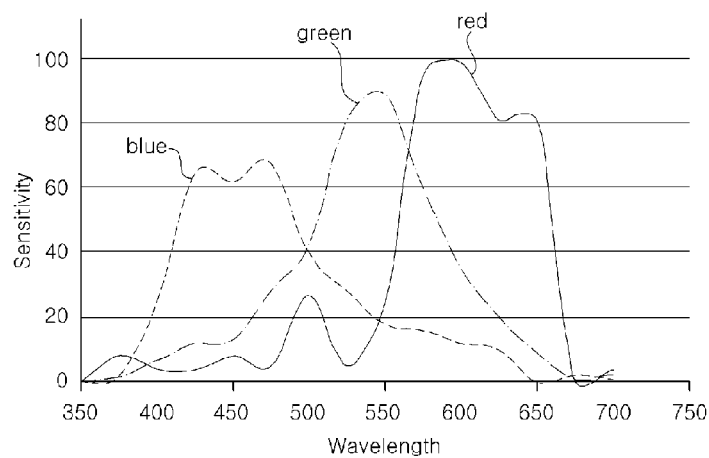
FIG. 1 is a graph depicting spectral sensitivity of a CMOS image sensor for a camera.

Embodiments of the present invention will be described in more detail with reference to the accompanying drawings. It should be understood that the following embodiments are given by way of illustration only to provide thorough understanding of the invention to those skilled in the art. Therefore, the present invention is not limited to the following embodiments and may be embodied in different ways. Further, the widths, lengths, and thicknesses of certain elements, layers or features may be exaggerated for clarity. Like components will be denoted by like reference numerals throughout the specification.

Figure 2:
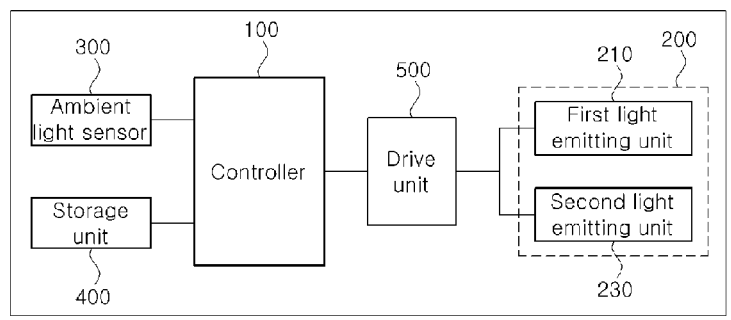
FIG. 2 is a block diagram of a light emitting apparatus in accordance with one embodiment of the present invention.

FIG. 2 is a block diagram of a light emitting apparatus in accordance with one embodiment of the present invention.

Referring to FIG. 2, a light emitting apparatus includes a controller 100, a light emitting unit 200, an ambient light sensor 300, a storage unit 400, and a drive unit 500. Further, the light emitting unit 200 includes a first light emitting unit 210 and a second light emitting unit 230.

The controller 100 operates the first and second light emitting units 210, 230. The controller 100 sends a control signal to the drive unit 500 to operate the first and second light emitting units 210, 230 via the drive unit 500.

The drive unit 500 generates electric current for operation of the first and second light emitting units 210, 230. For example, the drive unit 500 may operate the first and second light emitting unit 210, 230 in a pulse width modulation manner or may independently operate the first and second light emitting units 210, 230. Thus, it is possible to obtain a spectrum distribution of desired spectrum intensity by setting the magnitude or pulse width of electric current to be applied to the first light emitting unit 210 to be different from those of the electric current to be applied to the second light emitting unit 230.

The controller 100 may operate the first and second light emitting units 210, 230 according to a spectrum distribution of ambient light with reference to the spectrum distribution of the ambient light detected by the light sensor 300.

The ambient light sensor 300 detects the spectrum distribution of ambient light, for example, background light or outdoor light, outside the light emitting apparatus. Although an image sensor of a camera or the like can be used as the ambient light sensor 300, a separate optical sensor for detecting ambient light may be provided independent of the image sensor. Such an ambient light sensor 300 detects the spectrum distribution of the background light, for example, relative intensity of blue, green or red light. Furthermore, the ambient light sensor 300 may detect the spectrum distribution of light emitted from the first and second light emitting units 210, 230.

The controller 100 may operate the first and second light emitting units 210, 230 according to the spectrum distribution detected by the ambient light sensor 300 to emit light matching the ambient light.

Here, the storage unit 400 stores spectrum distribution data according to electric current for operation of the first and second light emitting units 210, 230. The spectrum distribution data may be measured for each light emitting unit when manufacturing the light emitting units 210, 230.

The controller 100 may operate the first and second light emitting units 210, 230 to emit light matching the spectrum distribution of the ambient light detected by the ambient light sensor 300. At this time, the controller 100 may determine operating parameters such as the magnitude or pulse widths of electric current applied to the first or second light emitting unit 210 or 230 with reference to the data stored in the storage unit 400.

Furthermore, the controller 100 may control the ambient light sensor 300 to detect light emitted from the first and second light emitting units 210, 230, and may compare the spectrum distributions of the light emitted from the first and second light emitting units 210, 230 with the spectrum distribution data stored in the storage unit 400. With the comparison result, the controller 100 may operate the first and second light emitting units 210, 230 to emit light having a desired spectrum distribution through accurate correction of the operating conditions for the first and second light emitting units 210, 230.

For a camera phone or digital camera, a user can determine a desired color upon photographing. At this time, the controller 100 may operate the first and second light emitting units 210, 230 according to conditions set by a user. Further, the controller 100 may accurately correct the operating conditions of the first and second light emitting units 210, 230 by comparing the spectrum distribution of the light emitted from the first and second light emitting units 210, 230 and detected by the ambient light sensor 300 with a spectrum distribution of the color set by a user.

Figure 3:
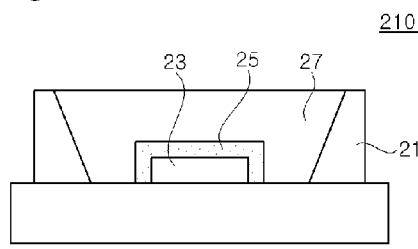
FIG. 3 is a sectional view of a light emitting unit inside the light emitting apparatus in accordance with the embodiment of the present invention.
Figure 4:
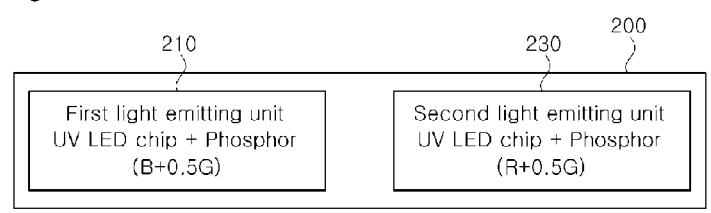
FIG. 4 is a view of a first light emitting unit and a second light emitting unit of a light emitting unit in accordance with one embodiment of the present invention.

Each of the first and second light emitting units 210, 230 includes light emitting diodes and phosphors. FIG. 3 is a sectional view of the first and second light emitting units 210, 230 inside the light emitting apparatus in accordance with the embodiment of the present invention, and FIG. 4 is a view of first and second light emitting units in accordance with one embodiment of the present invention.

Referring to FIG. 3, the first or second light emitting unit 210 or 230 includes a package body 21, a light emitting diode chip 23, a wavelength converter 25, and, optionally, a molding part 27. Further, the first or second light emitting unit 210 or 230 may include a lens (not shown) to adjust an orientation angle of light emitted from the light emitting diode chip 23.

As the package body 21, any suitable package element such as a printed circuit board or a lead frame may be used so long as the element can mount the light emitting diode chip 23 thereon. As shown in the drawings, the package body 21 may have a recess on which the light emitting diode chip 23 is mounted, and may reflect light on an internal wall of the recess. However, the present invention is not limited to the package body 21 including the recess.

The light emitting diode chip 23 is mounted on the package body 21 and electrically connected to lids (not shown). The light emitting diode chip 23 may be a gallium nitride-based light emitting diode which emits UV light or visible light.

The wavelength converter 25 is placed on the light emitting diode chip 23 and converts wavelengths of light emitted from the light emitting diode chip 23. The wavelength converter 25 includes phosphors which are excited by light emitted from the light emitting diode chip 23 to emit visible light. The wavelength converter 25 may be a conformal coating layer uniformly covering the light emitting diode chip 23, without being limited thereto. For example, the wavelength converter 25 may be formed by mixing the phosphors with a molding resin, followed by dotting the mixture.

The molding part 27 protects the light emitting diode chip 23 and the wavelength converter 25 from external factors, such as humidity or impact. The molding part 27 may be formed of silicone or epoxy resins. The phosphors may be dispersed in the molding part 27.

The first or second light emitting unit 210 or 230 emits light through wavelength conversion of the wavelength converter 25 when the light is emitted from light emitting diode chip 23. The light emitted from the first light emitting unit 210 or the second light emitting unit 230 is emitted in the form of light converted by the wavelength converter 25 or in the form of mixed light of some light emitted from the light emitting diode chip 23 and the light converted by the wavelength converter 25.

Next, the first and second light emitting units 210, 230 according to one embodiment will be described in more detail with reference to FIG. 4.

Referring to FIG. 4, the first light emitting unit 210 includes a UV LED chip, a blue phosphor B and a green phosphor G to emit blue light and green light. The second light emitting unit 230 includes a UV LED chip, a red phosphor R and a green phosphor G to emit red light and green light.

Meanwhile, since the green phosphor G is commonly disposed in the first and second light emitting units 210, 230, the amount of the green phosphor G disposed in each of the light emitting units 210, 230 is ½ the total amount of the green phosphor. Thus, blue light emitted from the first light emitting unit 210 has higher intensity than green light emitted therefrom, and red light emitted from the second light emitting unit 230 has higher intensity than green light emitted therefrom. However, the green phosphor is not necessarily disposed in the same amount in the first and second light emitting units 210, 230, and may be disposed in different amounts therein.

The controller 100 (see FIG. 2) operates the first and second light emitting units 210, 230 to emit light corresponding to a wavelength distribution of ambient light emitted by the ambient light sensor 300. The first and second light emitting units 210, 230 emit light having a desired wavelength distribution through combination of light emitted therefrom. For example, if the ambient light detected by the ambient light sensor 300 has high intensity in the blue wavelength band, the controller 100 adjusts the magnitude and pulse widths of electric current applied to the first and second light emitting units 210, 230 such that the first light emitting unit 210 emits light having higher intensity that that of light emitted from the second light emitting unit 230. On the contrary, if the ambient light detected by the ambient light sensor 300 has high intensity in the red wavelength band, the controller 100 adjusts the magnitude and pulse widths of electric current applied to the first and second light emitting units 210, 230 such that the second light emitting unit 230 emits light having higher intensity that that of light emitted from the first light emitting unit 210. Here, as described with reference to FIG. 2, the controller 100 may operate the first and second light emitting units 210, 230 based on the spectrum data according to the electric current applied to the first and second light emitting units 210, 230, as stored in the storage unit 400.

Further, with the first and second light emitting units 210, 230 operated temporarily, the spectrum distributions of the light emitted from the first and second light emitting units 210, 230 may be detected by the ambient light sensor 300. The spectrum distributions of the light emitted from the first and second light emitting units 210, 230 detected by the ambient light sensor 300 may be compared with the spectrum distribution data stored in the storage unit 400 or with the spectrum distribution of the color set by a user. With the comparison result, the operating conditions of the first and second light emitting units 210, 230 may be accurately corrected.

Although the green phosphor G is illustrated as being commonly disposed both in the first and second light emitting units 210, 230 in this embodiment, a blue phosphor B or a red phosphor R may be commonly disposed both in the first and second light emitting units 210, 230 instead of the green phosphor G.

Figure 5:
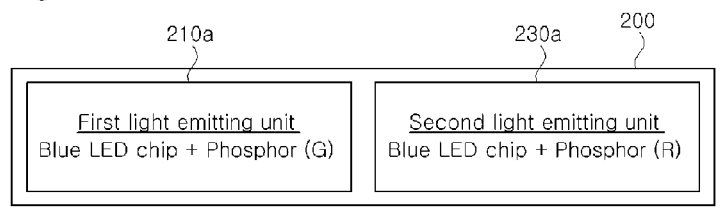
FIG. 5 is a view of a first light emitting unit and a second light emitting unit of a light emitting unit in accordance with another embodiment of the present invention.

FIG. 5 is a view of a first light emitting unit 210a and a second light emitting unit 230a of a light emitting unit in accordance with another embodiment of the present invention.

Referring to FIG. 5, the light emitting unit 200 according to this embodiment also includes a first light emitting unit 210a and a second light emitting unit 230a as in the embodiment of FIG. 4, and includes a different combination of a light emitting diode and phosphors than the above embodiment.

Specifically, the first light emitting unit 210a includes a blue LED chip and a green phosphor G to emit mixed light of blue light and green light, and the second light emitting unit 230a includes a blue LED chip and a red phosphor R to emit mixed blue light and red light.

According to detection results of the ambient light sensor 300, the controller 100 (FIG. 2) operates the first and second light emitting units 210a, 230a by setting suitable operating conditions for the first and second light emitting units 210a, 230a, for example, magnitude or pulse widths of electric current to be applied thereto.

Figure 6:
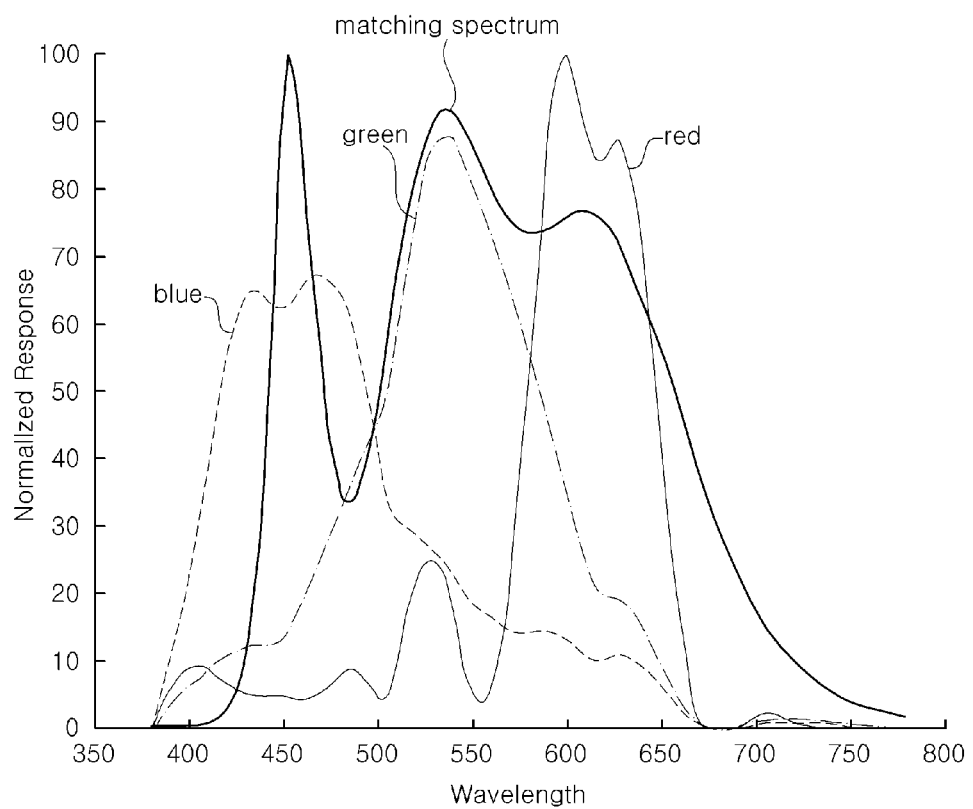
FIG. 6 is a graph depicting a spectrum distribution of a light emitting apparatus in accordance with another embodiment of the present invention.

When ambient light is daylight, the first and second light emitting units 210a, 230a may emit light matching the spectral sensitivity of the CMOS image sensor. FIG. 6 shows one example of the spectrum distribution matching the spectral sensitivity of the CMOS image sensor. Light having the spectrum distribution of FIG. 6 may be obtained by adjusting the spectrum distribution of each of the first light emitting unit 210a and the second light emitting unit 230a.

On the other hand, if the ambient light has higher intensity in the blue wavelength band than in the red wavelength band, the first light emitting unit 210a is operated to emit light having higher intensity than that of light emitted from second light emitting unit 230a. On the contrary, if the ambient light has higher intensity in the red wavelength band than in the blue wavelength band, 230 the second light emitting unit 230a is operated to emit light having higher intensity that that of the light emitted from the first light emitting unit 210a.

In this way, according to the present embodiment, the spectrum distribution of light emitted from light emitting unit 200 may be adjusted corresponding to the spectrum distribution of the ambient light as in the above embodiment.

Figure 7:
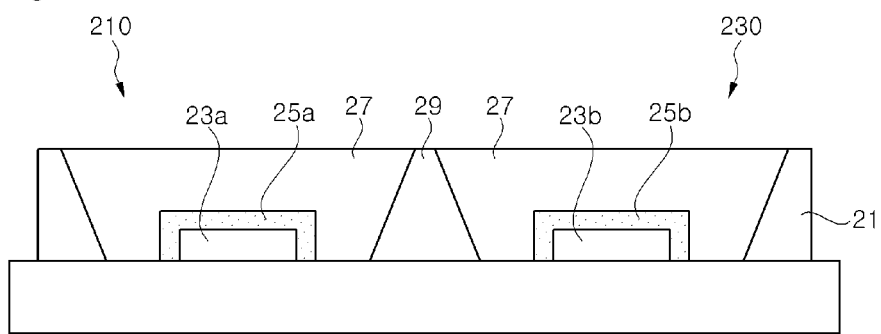
FIG. 7 is a sectional view of a light emitting unit inside a light emitting apparatus in accordance with a further embodiment of the present invention.

FIG. 7 is a sectional view of a light emitting unit according to a further embodiment of the present invention.

Referring to FIG. 7, first and second light emitting units 210, 230 according to this embodiment is similar to the first and second light emitting units 210, 230 in the embodiment of FIG. 3, except that the first and second light emitting units 210, 230 are assembled into a single package.

Specifically, light emitting diode chips 23a, 23b are commonly mounted on a package body 210. The light emitting diode chips 23a, 23b may be placed on recesses partitioned by a wall 29. Wavelength converters 25a, 25b cover the light emitting diode chips 23a, 23b, respectively. In addition, a molding part 27 may separately cover each of the light emitting diode chips 23a, 23b. Alternatively, the molding part 27 may commonly cover the light emitting diode chips 23a, 23b and the wall 29. Further, a lens (not shown) may be placed above the first and second light emitting units 210, 230.

According to the present embodiment, the first and second light emitting units 210, 230 may be placed close to each other, thereby reducing an area of the light emitting unit 200.

According to embodiments of the present invention, the light emitting unit is divided into the first and second light emitting units 210, 230 to be operated to emit light corresponding to the spectrum distribution of ambient light detected by the ambient light sensor 300. Thus, the first and second light emitting units 210, 230 may emit light having a similar spectrum distribution to that of the ambient light.

The light emitting apparatus according to the embodiments of the present invention may be used as a flash light source for a camera phone or a digital camera. In this case, the ambient light sensor 300 may detect a spectrum distribution of ambient light, that is, a spectrum distribution of a background light source, and the controller 100 may operate the first and second light emitting units 210, 230 to emit light having the spectrum distribution matching that of the ambient light. Accordingly, it is possible to provide a picture of natural colors by reducing a difference in spectrum between a background image and an object image. In addition, the light emitting apparatus allows the first and second light emitting units 210, 230 to emit light before photographing an object and detects the light emitted from the first and second light emitting units 210, 230 to confirm whether light having a desired spectrum distribution is emitted from the first and second light emitting units in order to achieve accurate correction of the operating conditions of the first and second light emitting units 210, 230 based on results.

The light emitting apparatus according to the embodiments of the present invention may be used for specific lighting such as indoor lighting. In this case, the ambient light sensor 300 detects a spectrum distribution of outdoor light and the controller 100 may operate the first and second light emitting units 210, 230 to emit light having a spectrum distribution matching the spectrum distribution of the outdoor light. The light emitting apparatus may adjust the spectrum distribution of light emitted from the light emitting units in synchronization with the spectrum distribution of the outdoor light. Furthermore, the light emitting apparatus stores data of the spectrum distribution of ambient light according to time and may realize light having a desired spectrum distribution using the light emitting units after a predetermined period of time, such that the light emitting units can emit light corresponding to the spectrum distribution of sunlight in the morning, at noon or in the evening, as needed.

In the embodiments of the present invention, the storage unit 400 stores the spectrum data of the first and second light emitting units 210, 230 in the light emitting apparatus, and the controller 100 provides suitable operating conditions based on the data stored in the storage unit 400. Alternatively, when the first and second light emitting units 210, 230 of the light emitting apparatus are operated in uniform operating characteristics through tight binning, it is not necessary to store the respective operating datum of the first and second light emitting units 210, 230, in the storage unit 400.

Although some embodiments have been described herein, it should be understood by those skilled in the art that various modifications, variations, and alterations can be made without departing from the spirit and scope of the invention. Therefore, it should be understood that these embodiments are given to provide complete disclosure of the invention and to provide thorough understanding of the invention to those skilled in the art. The scope of the invention is limited only by the accompanying claims and equivalents thereof.

The invention claimed is:

1. A light emitting apparatus comprising:
   a first light emitting unit including a first light emitting diode and a first phosphor;
   a second light emitting unit including a second light emitting diode and a second phosphor;
   an ambient light sensor configured to detect light information including a spectrum distribution of ambient light; and
   a controller communicatively coupled to the ambient light sensor, the first light emitting unit, and the second light emitting unit, the controller configured to receive the light information from the ambient light sensor and send a control signal to operate the first and second light emitting units based at least partly on the received light information;
   wherein a spectrum distribution provided by combination of the first and second light emitting units corresponds to a wavelength distribution of spectral sensitivity of a CMOS image sensor.

2. The light emitting apparatus according to claim 1, further comprising a drive unit communicatively coupled to the controller, the first light emitting unit, and the second light emitting unit, wherein the drive unit is configured to receive the control signal from the controller and responsive to the received control signal, adjust a magnitude or a pulse width of an electric current applied to the first and second light emitting units to adjust an intensity of light emitted from the first and second light emitting units.

3. The light emitting apparatus according to claim 1, further comprising: a drive unit communicatively coupled to the controller, the first light emitting unit, and the second light emitting unit, wherein the drive unit is configured to receive the control signal from the controller and responsive to the received control signal, generate an electric current to operate the first and second light emitting units in a pulse width modulation manner.

4. The light emitting apparatus according to claim 1, wherein the controller is configured to send the control signal to cause an electric current to be applied to the first light emitting unit and the second light emitting unit;
   wherein the ambient light sensor is configured to detect the light information including a spectrum distribution of light emitted from the first and second light emitting units; and
   further comprising a storage unit communicatively coupled to the controller, wherein the storage unit is configured to store data of the spectrum distribution of the light emitted from the first and second light emitting units based at least partly on the electric current applied to the first and second light emitting units.

5. The light emitting apparatus according to claim 4, wherein the controller is configured to send the control signal to operate the first and second light emitting units with reference to the data stored in the storage unit.

6. The light emitting apparatus according to claim 1, wherein the first and second light emitting diodes emit UV light, the first phosphor comprises a blue phosphor and a green phosphor, and the second phosphor comprises a red phosphor and a green phosphor.

7. The light emitting apparatus according to claim 6, wherein the first light emitting unit emits blue light having higher intensity than that of green light emitted from the first light emitting unit, and the second light emitting unit emits red light having higher intensity than that of green light emitted from the second light emitting unit.

8. The light emitting apparatus according to claim 1, wherein the first and second light emitting diodes emit blue light, the first phosphor comprises a green phosphor, and the second phosphor comprises a red phosphor.

9. The light emitting apparatus according to claim 8, wherein the first light emitting unit emits green light having higher intensity than that of blue light emitted from the first light emitting unit, and the second light emitting unit emits red light having higher intensity than that of blue light emitted from the second light emitting unit.

10. The light emitting apparatus according to claim 4,
    wherein the controller is configured to perform operations including:
    compare the spectrum distribution of the light emitted from the first and second light emitting units based on a given electric current applied to the first and second light emitting units as detected by the ambient light sensor with the spectrum distribution data of the first and second light emitting units based on a previously applied electric current stored in the storage unit, and
    send the control signal to correct operating conditions of the first and second light emitting units responsive to the comparison.

11. An electronic device comprising:
    a first light emitting unit including a first light emitting diode and a first phosphor;
    a second light emitting unit including a second light emitting diode and a second phosphor; and
    an ambient light sensor to detect light information including a spectrum distribution of ambient light, wherein the first and second light emitting units are configured to emit light having a spectrum distribution corresponding to the detected spectrum distribution of ambient light;

wherein a spectrum distribution provided by combination of the first and second light emitting units also corresponds to a wavelength distribution of spectral sensitivity of a CMOS image sensor.

12. The electronic device according to claim 11, wherein the first light emitting unit emits light having higher intensity in a blue wavelength band than in a red wavelength band, and the second light emitting unit emits light having higher intensity in the red wavelength band than in the blue wavelength band.

13. The electronic device according to claim 11, further comprising:

a controller communicatively coupled to the ambient light sensor, the controller configured to send a control signal to cause an electric current to be applied to the first and second light emitting units to operate the first and second light emitting units;

wherein the ambient light sensor is configured to detect the light information including spectrum distribution of light emitted from the first and second light emitting units; and a storage unit which communicatively coupled to the controller to store data of the detected spectrum distribution based on the electric current applied to the first and second light emitting units.

14. The electronic device according to claim 13, wherein the controller is configured to perform operations including:

compare the spectrum distribution of the light emitted from the first and second light emitting units based on a given electric current applied to the first and second light emitting units as detected by the ambient light sensor with the spectrum distribution data stored in the storage unit based on a previously applied electric current; and send the control signal to correct the light emitted from the first and second light emitting units.

15. An electronic device capable of photographing an object, comprising:

a first light emitting unit including a first light emitting diode and a first phosphor;

a second light emitting unit including a second light emitting diode and a second phosphor;

an ambient light sensor detecting a spectrum distribution of ambient light or a spectrum distribution of light emitted from the first and second light emitting units; and wherein a spectrum distribution provided by combination of the first and second light emitting units corresponds to a wavelength distribution of spectral sensitivity of a CMOS image sensor.

16. The electronic device according to claim 15, further comprising:

a controller communicatively coupled to the ambient light sensor, the controller to generate a control signal to cause an electric current to be applied to the first and second light emitting units to correct operating conditions of the first and second light emitting units based at least partly on the spectrum distribution of the ambient light or the spectrum distribution of the light emitted by the first and second light emitting units detected by the ambient light sensor.

17. The electronic device according to claim 16, further comprising:

a storage unit communicatively coupled to the controller, the storage unit to store spectrum distribution data according to the electric current applied to the first and second light emitting units, wherein the controller is configured to compare the spectrum distribution of the light emitted by the first and second light emitting units responsive to a given electric current applied to the first and second light emitting units detected by the ambient light sensor with the spectrum distribution data stored in the storage unit responsive to a previously applied electric current to correct the operating conditions of the first and second light emitting units.

18. The electronic device according to claim 15, wherein the electronic device includes a camera phone or a digital camera.

* * * * *